(12) United States Patent
Iwabuchi

(10) Patent No.: US 7,074,663 B2
(45) Date of Patent: Jul. 11, 2006

(54) METHOD OF MAKING SEMICONDUCTOR DEVICE INCLUDING A FIRST SET OF WINDOWS IN A MASK WITH LARGER RATIO OF SURFACE AREA THAN A SECOND SET OF WINDOWS

(75) Inventor: Akio Iwabuchi, Tokyo (JP)

(73) Assignee: Sanken Electric Co., Ltd. (JP)

( * ) Notice: Subject to any disclaimer, the term of this patent is extended or adjusted under 35 U.S.C. 154(b) by 173 days.

(21) Appl. No.: 10/890,688

(22) Filed: Jul. 14, 2004

(65) Prior Publication Data

US 2004/0248389 A1 Dec. 9, 2004

Related U.S. Application Data

(63) Continuation of application No. PCT/JP03/00257, filed on Jan. 15, 2003.

(30) Foreign Application Priority Data

Jan. 16, 2002 (JP) ............................ 2002-008017

(51) Int. Cl.
*H01L 21/8238* (2006.01)

(52) U.S. Cl. ...................... 438/199; 438/218; 438/224; 438/231

(58) Field of Classification Search ................ 438/199, 438/218, 224, 231
See application file for complete search history.

(56) References Cited

U.S. PATENT DOCUMENTS

| 4,795,716 A | * | 1/1989 | Yilmaz et al. ............... 438/209 |
| 5,330,922 A | | 7/1994 | Erdeljac et al. ............. 438/207 |
| 2004/0145027 A1 | * | 7/2004 | Nitta et al. .................. 257/492 |

FOREIGN PATENT DOCUMENTS

| JP | 59-029436 | 2/1984 |
| JP | 06-045538 | 2/1994 |
| JP | 06-118622 | 4/1994 |
| JP | 06-314663 | 11/1994 |
| JP | 09-326441 | 12/1997 |
| JP | 10-242311 | 9/1998 |

* cited by examiner

*Primary Examiner*—William M. Brewster
(74) *Attorney, Agent, or Firm*—Woodcock Washburn LLP

(57) ABSTRACT

A method of creating two or more semiconductor elements of different characteristics in one and the same semiconductor substrate. Two antimony-diffused regions are formed in a p-type semiconductor region (of a semiconductor substrate for providing embedded layers for two field-effect transistors of unlike characteristics. Then the substrate is overlaid with a mask bearing two different patterns of windows. Then phosphor is introduced into the substrate through the mask windows to create phosphor-diffused regions in overlying relationship to the antimony-diffused regions. The two window patterns of the mask are such that the two phosphor-diffused regions differ in mean phosphor concentration. The embedded layers for the two FETs are obtained as an n-type epitaxial layer is subsequently formed on the p-type semiconductor region in which have been created the antimony-diffused regions and phosphor-diffused regions.

7 Claims, 13 Drawing Sheets

US 7,074,663 B2

METHOD OF MAKING SEMICONDUCTOR DEVICE INCLUDING A FIRST SET OF WINDOWS IN A MASK WITH LARGER RATIO OF SURFACE AREA THAN A SECOND SET OF WINDOWS

RELATED APPLICATION

This is a continuation of Application PCT/JP03/00257, filed Jan. 15, 2003, which claims priority to Japanese Patent Application No. 2002-008017 filed Jan. 16, 2002.

BACKGROUND OF THE INVENTION

This invention relates to a method of making semiconductor devices each constituted of a plurality of semiconductor elements having layers embedded therein.

A semiconductor device having an embedded layer is disclosed for example in U.S. Pat. No. 5,330,922. Japanese Unexamined Patent Publication No. 10-242311 discloses a semiconductor device such that a single semiconductor substrate has formed thereon both an insulated-gate field-effect transistor and a bipolar transistor which have layers of different thicknesses embedded therein. The field-effect transistor of this latter prior art device has its embedded layer fabricated by diffusion of antimony and phosphorus whereas the bipolar transistor has its embedded layer fabricated by diffusion of antimony.

Unlike the second mentioned prior art device, however, there exist needs for semiconductor devices in which the embedded layers of the two different kinds of semiconductor elements are fabricated to different thicknesses in one and the same semiconductor substrate using the same impurities. For example, in integrally incorporating two different types of insulated-gate field-effect transistors in the same semiconductor substrate, one of these transistors may be required to be less in drain-source resistance than the other, and this other transistor to be higher in drain-source voltage-withstanding capability. These requirements can be met by making the embedded layer of the one transistor greater in thickness and higher in impurity concentration than that of the other transistor. The greater thickness and higher impurity concentration of the embedded layer of the one field-effect transistor will lead to reduction in the thickness of the drain region of the semiconductor substrate and hence to a drop in drain-source resistance during the conduction of the transistor and in drain-source voltage-withstanding capability.

Two different methods might be contemplated for providing the embedded layers that differ in both thickness and impurity concentration. One is to employ impurities having different rates of diffusion for the respective embedded layers. The other is to diffuse impurities for a different period of time for each embedded layer. These methods are both unsatisfactory, however, as they demand a dedicated process for the fabrication of each embedded layer, inviting an intolerable rise in the manufacturing costs of the semiconductor devices of the kind in question.

The present invention aims, therefore, at the provision of a method capable of concurrently creating two different types of embedded layers that differ in both thickness and impurity concentration.

SUMMARY OF THE INVENTION

The invention for the solution of the foregoing problems and the attainment of the foregoing objects may now be explained using the reference characters in the attached drawings showing the preferred modes of carrying out the invention. However, as used in the claims appended hereto and in the following description of this invention, the reference characters are meant to expedite the understanding of the invention and not to impose limitations thereupon.

The method of manufacturing a semiconductor device according to the invention comprises the steps of:

(a) Providing a semiconductor substrate (41) having formed therein a first semiconductor region (6) of a first conductivity type, said first semiconductor region having both a first preselected surface zone (49) for creation of a first embedded layer (8 or $8_a$) for a first semiconductor element (1 or $1_a$) and a second preselected surface zone (50) for creation of a second embedded layer (9 or $9_a$) for a second semiconductor element (2 or $2_a$);

(b) Overlaying a mask (46, $46_a$ or $46_b$) on a surface of said first semiconductor region (6), said mask having both a first open pattern (47, $47_a$ or $47_b$) on said first preselected surface zone (49) and a second open pattern (48 or $48_a$) on said second preselected surface zone (50), said first and said second open pattern of said mask being such that the ratio ($S_a/S_1$) of the area ($S_a$) of said first open pattern to the area ($S_1$) of said first preselected surface zone is greater than the ratio ($S_b/S_2$) of the area ($S_b$) of said second open pattern to the area ($S_2$) of said second preselected surface zone;

(c) Creating a second semiconductor region (51 or $51_a$) and a third semiconductor region (52) as parts of said first embedded layer (8 or $8_a$) and said second embedded layer (9 or $9_a$) by introducing an impurity substance of a second conductivity type, opposite to said first conductivity type, into said first semiconductor region (6) through said first open pattern (47, $47_a$ or $47_b$) and said second open pattern (48 or $48_a$) in said mask; and (d) Causing an epitaxial layer (7) of said second conductivity type, which is less in impurity concentration than said second and said third semiconductor region, to grow on the surface of said semiconductor substrate (41), thereby providing, due to thermal diffusion of the impurity substance in said second semiconductor region (51 or $51_a$) and said third semiconductor region (52), said first embedded layer (8 or $8_a$) and said second embedded layer (9 or $9_a$), said second embedded layer being less in thickness than said first embedded layer.

Each of the first and the second embedded layers (8 and 9) may be formed by two impurity substances having different coefficients of diffusion.

The first and the second semiconductor element may be insulated-gate field-effect transistors.

The first and the second semiconductor element may be bipolar transistors.

The impurity substance of the second conductivity type may be phosphorus.

The noted two different impurity substances may be antimony and phosphorus.

Each open pattern in the mask may include a parallel arrangement of strip-like windows (47, 48).

Each open pattern in the mask may be in the form of an array of windows ($47_a$, $48_a$).

The first open pattern in the mask may include a single window for exposing at least part of the second semiconductor region, and the second open pattern may include a plurality of windows (48 or $48_a$) for exposing as many parts of the third semiconductor region.

There may be additionally provided a third semiconductor element (3) having a third embedded layer (10).

The boundaries between the first and second embedded layers (8 and 9) and the first semiconductor region (6) are hereby defined as where the impurity substance of the second conductivity type making up these embedded layers equal in concentration the intrinsic impurities of the first semiconductor region. The boundaries between the first and second embedded layers (8 and 9) and the epitaxial layer (7) are likewise defined as where the impurity substance of the second conductivity type making up these embedded layers equal in concentration the intrinsic impurities of the epitaxial layer.

It will be noted that there exists a difference between the ratios ($S_a/S_1$ and $S_b/S_2$) of the areas ($S_a$ and $S_b$) of the first and second open patterns (47, 47$_a$ or 47$_b$, and 48 or 48$_a$) to the areas ($S_1$ and $S_2$) of the first and second preselected surface zones (49 and 50) for creation of the first and second embedded layers (8 or 8$_a$, and 9 or 9$_a$). This feature makes it possible for the desired embedded layers (8 or 8$_a$, and 9 or 9$_a$) of different thicknesses and different impurity concentrations to be created concurrently through the steps of the diffusion of the same impurity substance and of the growth of the same epitaxial layer 7. Two different types of semiconductor elements are thus fabricated without an increase in manufacturing steps, affording a substantive saving in the manufacturing costs of the semiconductor devices of the kind under consideration.

DESCRIPTION OF THE PREFERRED EMBODIMENTS

First Mode

Figure 1:
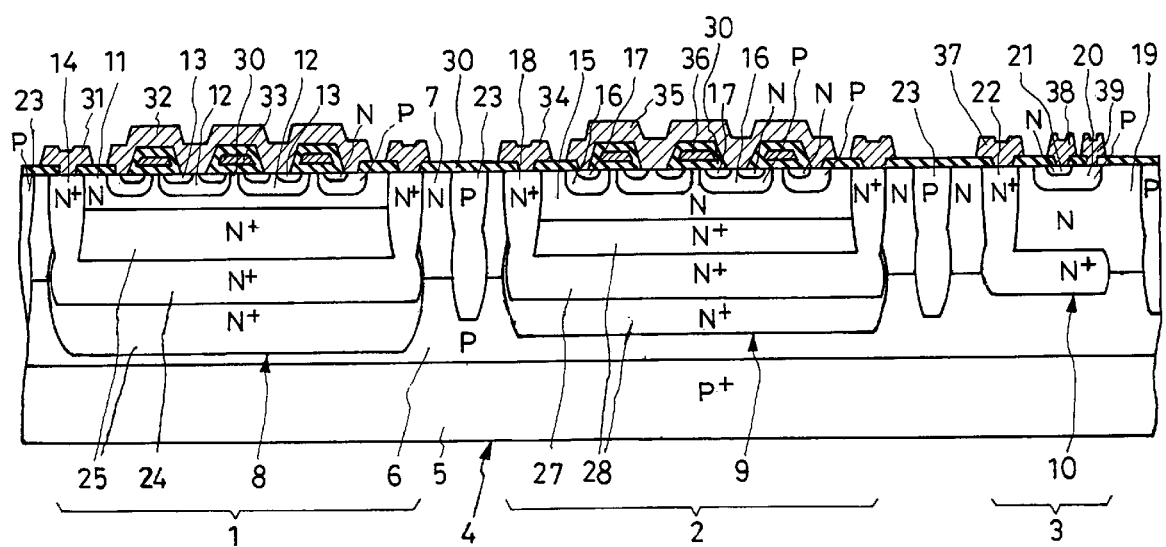
FIG. 1 is a section through the semiconductor device fabricated in the first preferred mode of carrying out the invention.
Figure 2:
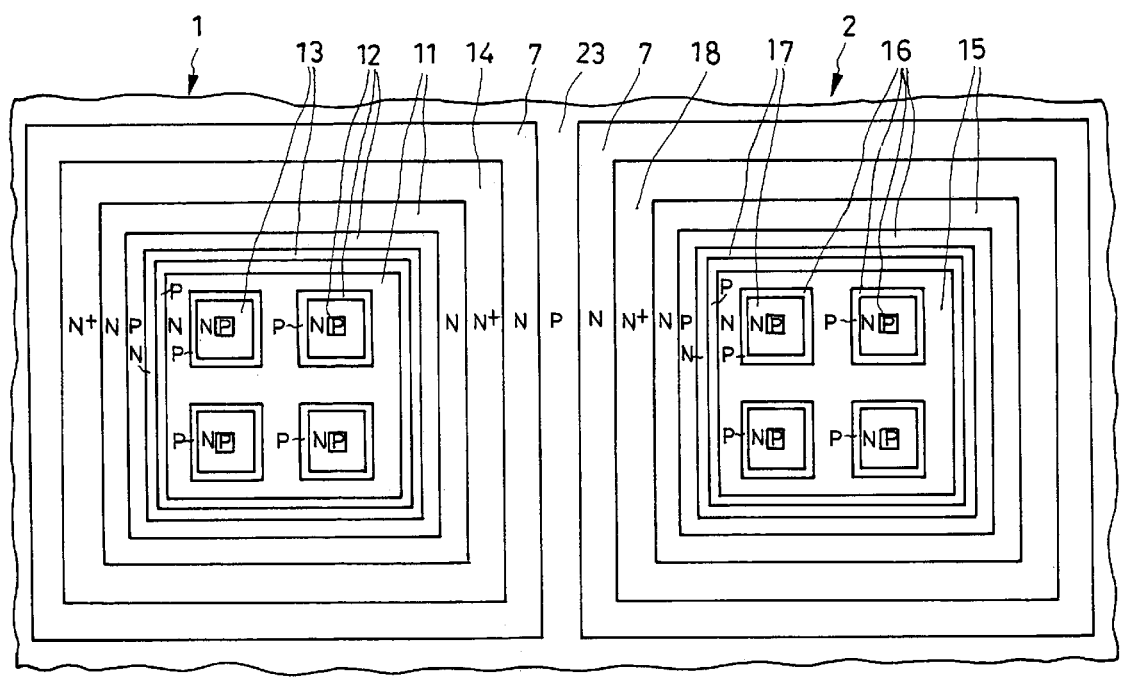
FIG. 2 is a plan view of the semiconductor device of FIG. 1, showing in particular the exposed surfaces of the field-effect transistors included therein.

The present invention will now be described more specifically in terms of the first preferred mode illustrated in FIGS. 1–10 of the above drawings. Fabricated according to the teachings of the invention, the composite semiconductor device of FIG. 1 comprises a first and a second insulated-gate field-effect transistor (hereinafter referred to simply as the FET) 1 and 2 as the noted first and second semiconductor elements, and a bipolar transistor (hereinafter referred to simply as the transistor) 3 as a third semiconductor element. The two FETs 1 and 2 and transistor 3 are all formed on and in a common silicon semiconductor body 4.

The silicon semiconductor body 4 comprises:

(a) a semiconductor substrate 41 having a p$^+$-type semiconductor region 5 and an overlying p-type semiconductor region 6;

(b) an n-type semiconductor region 7 grown epitaxially on the p-type semiconductor region 6;

(c) a first embedded layer 8 for the first FET 1;

(d) a second embedded layer 9 for the second FET 2;

(e) a third embedded layer 10 for the transistor 3;

(f) a drain region 11, p-type body regions 12, source region 13 and drain lead-out region 14 for the first FET 1;

(g) a drain region 15, p-type body regions 16, source region 17 and drain lead-out region 18 for a second FET 2;

(h) a collector region 19, base region 20, emitter region 21 and collector lead-out region 22 for the transistor 3; and (i) an inter-element separation region 23.

The noted p-type semiconductor region 6 represents the first semiconductor region of the first conductivity type in the claims appended hereto.

The first embedded layer 8 of the first FET 1 comprises a first part 24 of n$^+$-type semiconductor, and a pair of second parts 25 of n$^+$-type semiconductor, the latter being less in impurity concentration than the former. The first part 24 of the first embedded layer 8 contains both antimony and phosphorus as first and second n-type impurities. Disposed both above and below the first part 24, the second parts 25 of the first embedded layer 8 contain phosphorus as the second n-type impurity. The upper second part 25 is created by diffusion of phosphorus in the epitaxial layer 7. The lower second part 25 is formed by diffusion of phosphorus in the p-type semiconductor region 6. The second parts 25 of the first embedded layer 8 are intermediate in impurity concentration between the first part 24 and the n-type drain region 11, so that these second parts 25 serve to reduce the electrical resistance of the drain current path.

The second embedded layer 9 of the second FET 2 comprises a third part 27 of n$^+$-type semiconductor, and a pair of fourth parts 28 of n$^+$-type semiconductor, the latter being less in impurity concentration than the former. Like the first part 24 of the first embedded layer 8, the third part 27 of the second embedded layer 9 contains both antimony and phosphorus. Disposed both above and below the third part 27, the fourth parts 28 of the second embedded layer 9 contain phosphorus as the second n-type impurity, as do the second parts 25 of the first embedded layer 8. The upper fourth part 28 is created by diffusion of phosphorus in the epitaxial layer 7. The lower fourth part 28 is formed by diffusion of phosphorus in the p-type semiconductor region 6. The fourth parts 28 of the second embedded layer 9 are intermediate in impurity concentration between the third part 27 and the drain region 15, so that these fourth parts 25 serve to reduce the resistance of the drain current path of the second FET 2. The second embedded layer 9 is less in thickness than the first embedded layer 8.

The third embedded layer 10 for the transistor 3 is formed by diffusion of antimony.

The phosphorus-diffused second and fourth parts 25 and 28 of the first and second embedded layers 8 and 9 are set off from the p-type semiconductor region 6 along the boundaries where the phosphorus concentration of the second and fourth parts 25 and 28 equal the concentration of the intrinsic p-type impurities of the semiconductor region 6. The second and fourth parts 25 and 28 are set off from the n-type epitaxial layer 7 along the boundaries where the phosphorus concentration of the second and fourth parts 25 and 28 equal the concentration of the intrinsic n-type impurities of the epitaxial layer. The third embedded layer 10 is set off from the p-type semiconductor region 6 along the boundaries where they equal each other in impurity concentration. The third embedded layer 10 is set off from the n-type epitaxial layer 7 along the boundaries where they equal each other in impurity concentration.

The FETs 1 and 2 and transistor 3 are all formed in the n-type epitaxial layer 7.

The n-type semiconductor drain regions 11 and 15 of the FETs 1 and 2, and the n-type semiconductor collector region 19 of the transistor 3, are all constituted of parts of the n-type epitaxial layer 7.

The drain region 11 of the first FET 1 is formed from an n-type semiconductor and adjoins the upper second part 25 of the first embedded layer 8. This first embedded layer 8, constituted of the first and second parts 24 and 25, could be called the drain region of the first FET 1. The drain region 11 could be called the drain drift region. The p-type body regions 12 of the first FET 1 are formed island-like in the n-type drain region 11 to provide parts of the channels or current paths through the first FET. These body regions 12 could therefore be termed channel regions, island regions, or base regions. The source regions 13 of the first FET 1 are formed island-like in the p-type body regions 12 from an n-type semiconductor. The drain lead-out region 14 of the first FET 1 is made from an n$^+$-type semiconductor, joined to the first part 24 of the first embedded layer 8, and partly exposed at one major surface of the semiconductor substrate 4. This drain lead-out region 14 could be called a plug region.

The first FET 1 is provided with a drain electrode 31, source electrode 32, and gate electrode 33. The drain electrode 31 adjoins the drain lead-out region 14. The source electrode 32 adjoins both the source region 13 and those parts of the p-type body regions 12 which are opposite to their channel parts. The gate electrode 33 lies opposite the channel or current path parts of the p-type body regions 12 via an insulating film 30.

The drain region 15 of the second FET 2 is formed from an n-type semiconductor and adjoins the upper fourth part 28 of the second embedded layer 9. This second embedded layer 9, constituted of the third and fourth parts 27 and 28, could be called the drain region of the second FET 2. The drain region 15 could be called the drain drift region. The p-type body regions 16 of the second FET 2 are formed island-like in the n-type drain region 15. Like the p-type body regions 12 of the first FET 1 above, these body regions 16 of the second FET 2 could be termed channel regions, island regions, or base regions. The source regions 17 of the second FET 2 are formed island-like in the p-type body regions 16 from an n-type semiconductor. The drain lead-out region 18 of the second FET 2 is made from an n$^+$-type semiconductor, joined to the third part 27 of the second embedded layer 9, and partly exposed at the major surface of the semiconductor substrate 4.

The second FET 2 is provided with a drain electrode 34, source electrode 35, and gate electrode 36. The drain electrode 34 adjoins the drain lead-out region 18. The source electrode 35 adjoins both the source region 17 and those parts of the p-type body regions 16 which are opposite to their channel parts. The gate electrode 36 lies opposite the channel or current path parts of the p-type body regions 16 via the insulating film 30.

The collector region 19 of the transistor 3 is made from an n-type semiconductor and adjoins the third embedded layer 10. The base region 20 of the transistor 3 is made from a p-type semiconductor and formed island-like in the collector region 19. The emitter region 21 of the transistor 3 is made from an n-type semiconductor and formed island-like in the base region 20. The collector lead-out region 22 of the transistor 3 is made from an n$^+$-type semiconductor, adjoins the third embedded layer 10, and is partly exposed at one major surface of the semiconductor substrate 4.

The transistor 3 is provided with a collector electrode 37, emitter electrode 38, and base electrode 39. The collector electrode 37 is contiguous to the collector lead-out region 22, the emitter electrode 38 to the emitter region 21, and the base electrode 39 to the base region 20.

Made from a p-type semiconductor, the separation region 23 surrounds each of the first and second FETs 1 and 2 and transistor 3 as seen in a direction perpendicular to the surface of the semiconductor substrate 4 and, as seen in the section of FIG. 1, extends from one major surface of the substrate 4 down to the p-type semiconductor region 6.

The composite semiconductor device of FIG. 1 is fabricated by the method described hereinbelow with reference to FIGS. 1–10.

Figure 3:
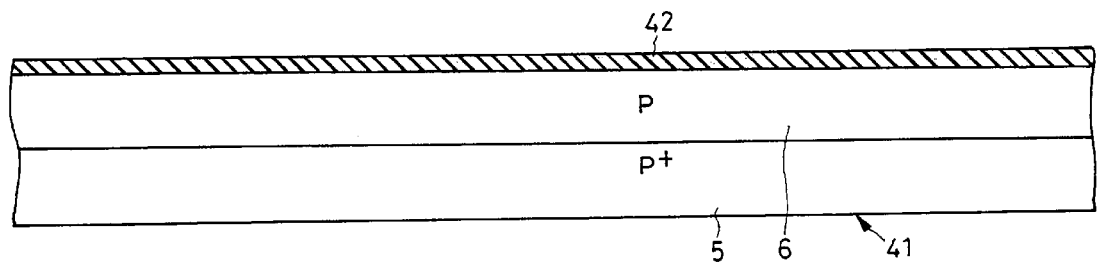
FIG. 3 is a section through a semiconductor substrate, with a silicon oxide film thereon, for fabrication of the semiconductor device of FIG. 1.

As shown in FIG. 3, there is first prepared a p-type silicon semiconductor substrate 41 which has the p$^+$-type semiconductor region 5 and p-type semiconductor region 6. Grown epitaxially on the p$^+$-type semiconductor region 5, the p-type semiconductor region 6 is approximately 40 micrometers thick and contains boron as p-type impurity with a concentration of approximately $1 \times 10^{15}$ cm$^{-3}$. This p-type semiconductor region 6 has three preselected surface zones 49, 50 and $10_a$', FIGS. 5 and 6, from which the three embedded layers 8, 9 and 10 are to be formed for the three semiconductor elements.

However, the p$^+$-type semiconductor 5 could be omitted, and the semiconductor substrate 41 could be constituted solely of the p-type semiconductor region 6.

Figure 4:
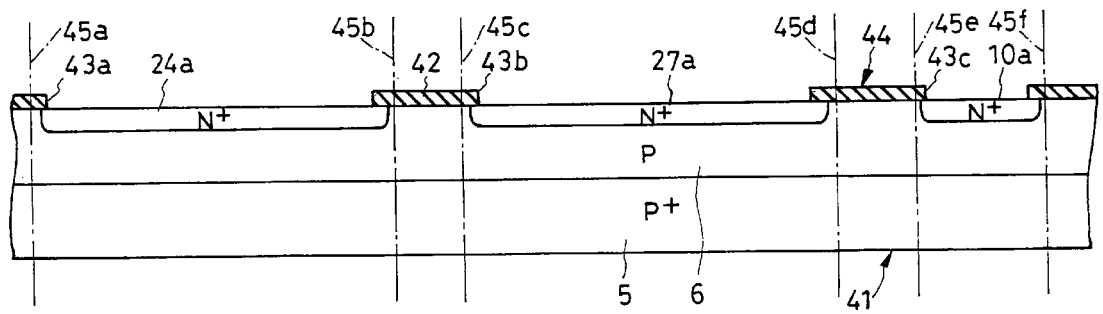
FIG. 4 is a section through the semiconductor substrate after the creation of a first mask by use of the silicon oxide film of FIG. 3 and the introduction of antimony therethrough.

Then, as shown in FIG. 3, a silicon oxide film 42 is formed on the flat top of the p-type semiconductor region 6. Thereafter, as shown in FIG. 4, three windows $43_a$, $43_b$ and $43_c$ for introduction of antimony are formed in the silicon oxide film 42 thereby obtaining a first mask 44 for selective impurity dispersion. The first antimony introduction window $43_a$ in the first mask 44 lies between two dot-and-dash lines $45_a$ and $45_b$, FIG. 4, at the opposite boundaries of the first preselected surface zone 49, FIGS. 5 and 6, for the first embedded layer 8. The second antimony introduction window 43$_b$ in the first mask 44 lies between other two dot-and-dash lines 45$_c$ and 45$_d$, FIG. 4, at the opposite boundaries of the second preselected surface zone 50 for the second embedded layer 9. The third antimony introduction window 43$_c$ in the first mask 4 lies between still other two dot-and-dash lines 45$_e$ and 45$_f$, FIG. 4, at the opposite boundaries of the third preselected surface zone 10$_a$' for the third embedded layer 10. As has been mentioned, the three preselected surface zones 49, 50 and 10$_a$' are intended for the three embedded layers 8, 9 and 10 in the p-type semiconductor region 6.

Then, as a first n-type impurity, antimony is selectively and jointly introduced and dispersed in the p-type semiconductor region 6 through the three antimony introduction windows 43$_a$, 43$_b$ and 43$_c$, thereby creating three antimony-diffused regions 24$_a$, 27$_a$ and 10$_a$' in the preselected surface zones 49, 50 and 10$_a$'. The first and second antimony-diffused regions 24$_a$ and 27$_a$ are used for creation of the first and second embedded layers 8 and 9 for the first and second FETs 1 and 2. The third antimony-diffused regions 10$_a$ are used for creation of the third embedded layer 10 for the transistor 3. The antimony-diffused regions 24$_a$, 27$_a$ and 10$_a$ are all formed by thermal diffusion of antimony, at a temperature of about 1230° C. for about 180 minutes, and have a surface impurity concentration of about $2 \times 10^{18}$ cm$^{-3}$ and a diffusion depth of about six micrometers. The p-type semiconductor region 6 is sometimes referred to as the first semiconductor region in this application, and the first and second antimony-diffused regions 24$_a$ and 27$_a$ as the second and third semiconductor regions.

Figure 5:
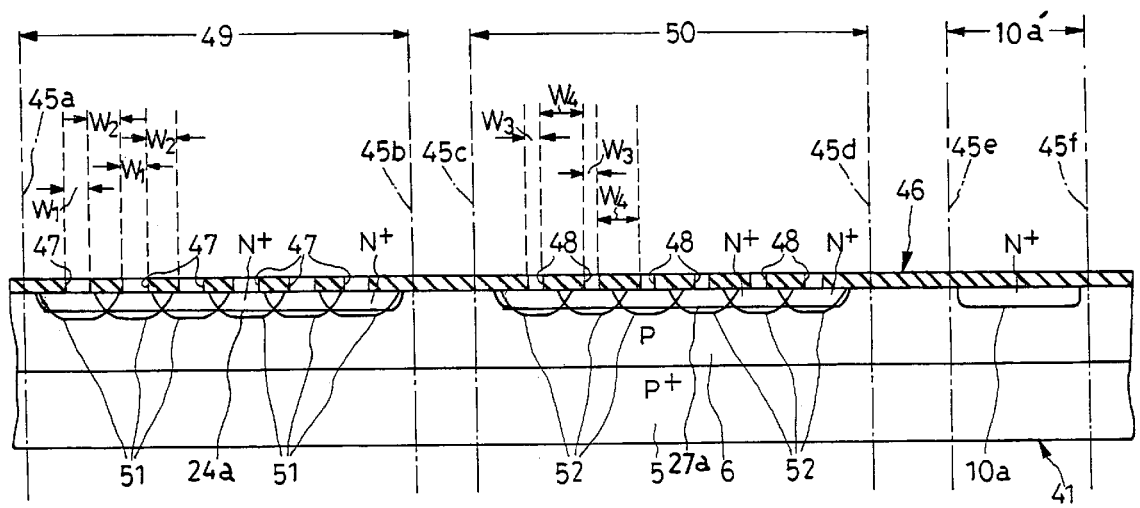
FIG. 5 is a section through the semiconductor substrate after the creation of a second mask thereon and the introduction of phosphorus therethrough.

Then, with the first mask 44 of FIG. 4 removed, there is formed a second mask 46 in the form of silicon oxide film capable of preventing impurity doping. As shown in FIG. 5, this second mask 46 is formed on the surface of the p-type semiconductor region 6 where the antimony-diffused regions 24$_a$, 27$_a$ and 10$_a$ have been created. The removal of the first mask 44 is not an absolute necessity, however; instead, the second mask might be formed by overlaying silicon oxide film on the first mask.

The second mask 46 has two different open patterns 47 and 48 formed therein for selective introduction of phosphorus, the second impurity. As seen in a plan view, or in a direction normal to the surface of the semiconductor substrate 41, the open patterns 47 and 48 are formed within the bounds of the preselected surface zones 49 and 50, respectively, for the embedded layers 8 and 9, the preselected surface zones 49 and 50 being indicated by the dot-and-dash lines in FIG. 6. The second mask 46 covers the space between the preselected surface zones 49 and 50 as well as the third preselected surface zone 10$_a$' for the third embedded layer 10.

The first open pattern 47 for phosphorus introduction is shown as a group of six elongate windows or slots in juxtaposition, each with a width $W_1$, exposing parts of the surface of the first preselected surface zone 49, that is, parts of the surface of the first antimony-diffused region 24$_a$. The six elongate windows 47 are spaced from each other by strip-like parts of the mask 46 each having a width $W_2$. The second open pattern 48 for phosphorus introduction likewise shown as six elongate windows or slots, each with a width $W_3$, exposing parts of the surface of the second preselected surface zone 50, that is, parts of the surface of the second antimony-diffused region 27$_a$. The six elongate windows 48 are spaced from each other by strip-like parts of the mask 46 each having a width $W_4$. The halves of the spacings $W_2$ between the first set of phosphorus introduction windows 47, and the halves of the spacings $W_4$ between the second set of phosphorus introduction windows 48, should both be sufficiently less than the lateral diffusion distances of the phosphorus introduced through these windows 47 and 48. The width $W_1$ of each of the first set of phosphorus introduction windows 47 is greater than the width $W_3$ of each of the second set of phosphorus introduction windows 48. The two sets of phosphorus introduction windows 47 and 48 have the same length $L_1$.

Let $S_1$ and $S_2$ be the surface areas of the preselected surface zones 49 and 50, $S_a$ the total area of the first set of phosphorus introduction windows 47, and $S_b$ the total area of the second set of phosphorus introduction windows 48. Then the ratio $S_a/S_1$ is greater in value than the ratio $S_b/S_1$. There may in practice be provided more, or less, than six phosphorus introduction windows 47, and more, or less, than six phosphorus introduction windows 48. Preferably, the phosphorus introduction windows 47 and 48 should be evenly distributed over the surfaces of the preselected surface zones 49 and 50. It is also desirable that, phosphorus being so high in diffusion rate, the peripheries of the phosphorus introduction windows 47 and 48 be disposed inwardly, as seen in a plan view, of the antimony introduction windows 43$_a$ and 43$_b$ in the first mask 44.

Then, through the windows 47 and 48 in the second mask 46, the second n-type impurity of phosphorus is introduced into the semiconductor substrate 41 which has the preformed antimony-diffused regions 24$_a$ and 27$_a$, thereby creating the phosphorus-diffused regions 51 and 52, FIG. 5. These phosphorus-diffused regions 51 and 52 will have a surface impurity concentration of about $3 \times 10^{17}$ cm$^{-3}$ and a diffusion depth of about eight micrometers, if phosphorus is diffused at a temperature of about 1150° C. for about 150 minutes. Phosphorus is so much more in diffusion coefficient or diffusion rate than antimony, the first impurity, that phosphorus diffuses deeper than the antimony-diffused regions 24$_a$ and 27$_a$. The overlapping parts of the antimony-diffused regions 24$_a$ and 27$_a$ and phosphorus-diffused regions 51 and 52 in FIG. 5 contain both antimony and phosphorus.

The spacings $W_2$ between the first set of phosphorus introduction windows 47 in that part of the mask 46 which overlies the first preselected surface zone 49 are so small that the thermal diffusion of phosphorus through these windows results in the creation of the phosphorus-diffused regions 51 that include parts underlying the mask strips between the windows.

The spacings $W_4$ between the second set of phosphorus introduction windows 48 in the mask part on the second preselected surface zone 50 are greater than the spacings $W_2$ between the first set of phosphorus introduction windows 47. The phosphorus-diffused regions 52 are nevertheless shown created in FIG. 6 under the mask strips between the second set of phosphorus introduction windows 48. Preferably, the spacings $W_2$ and $W_4$ between the two sets of phosphorus introduction windows 47 and 48 should not exceed twice the diffusion distance of phosphor in the thermal treatment before creation of the n-type semiconductor epitaxial layer 7, in order to create well integrated parts 25 and 28 of the first and second embedded layers 8 and 9.

Phosphorus contained in the phosphorus-diffused regions 51 and 52 is the highest in concentration at the surface of the semiconductor substrate 41, or at the surfaces of the antimony-diffused regions 24$_a$, 27$_a$ and 10$_a$ and dwindles downwardly of the semiconductor substrate 41. The amount of phosphorus per unit area is greater in the first preselected surface zone 49 than in the second preselected surface zone 50. In other words, as has been stated, the ratio $S_a/S_1$ of the total area $S_a$ of the first set of phosphorus introduction windows 48 to the area $S_1$ of the first preselected surface zone 49 is greater than the ratio $S_b/S_2$ of the total area of the second set of phosphorus introduction windows 48 to the area 52 of the second preselected surface zone 50. As a result, assuming that the areas $S_1$ and $S_2$ of the preselected surface zones 49 and 50 are the same, the amount of phosphorus is greater in the first preselected surface zone 49 than in the second 50. The greater amount of phosphorus introduction into the first preselected surface zone 49 than into the second 50 is tantamount to the fact that the mean phosphorus concentration is higher at the surface of the first preselected surface zone 49 than at the surface of the second 50.

Figure 7:
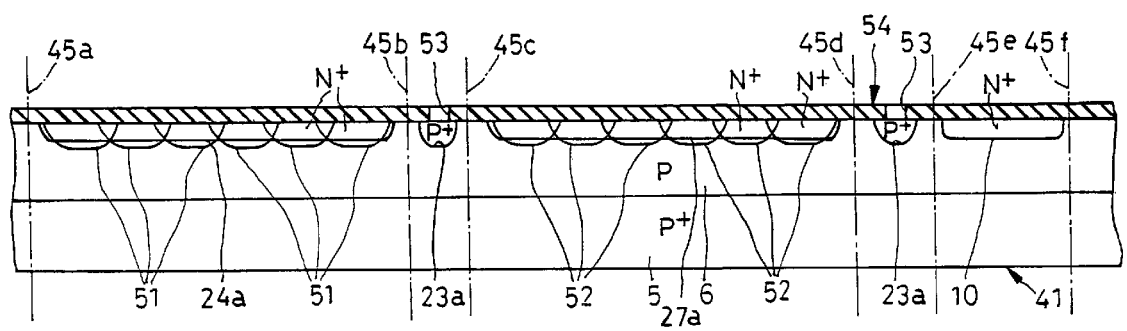
FIG. 7 is a section through the semiconductor substrate after the creation of a third mask and of a p$^+$-type semiconductor region for separation.

Then, as shown in FIG. 7, a third mask 54 in the form of silicon oxide film, with windows 53 formed therein, is overlaid on the surface of the semiconductor substrate 41, or on that of the p-type semiconductor region 6 in which there have been the antimony-diffused regions $24_a$, $27_a$ and $10_a$ and the phosphorus-diffused regions 51 and 52. The third mask 54 is formed after removal of the second mask 46, FIG. 2. It is also possible, however, to provide the third mask 53 by forming a film of silicon oxide on the second mask 46. The provision of the third mask 54 will be altogether unnecessary if the $p^+$ semiconductor regions $23_a$ or the inter-element separation regions 23 are to be formed by means other than masking.

The windows 53 in the first mask 54 are to be in register with the p-type separation regions 23, FIG. 1. Then boron, a p-type impurity, is diffused in the p-type semiconductor region 6 through the windows 53 in the third mask 54 thereby forming $p^+$-type semiconductor regions $23_a$. The $p^+$-type semiconductor regions $23_a$ may be formed for example at a diffusion temperature of about 1150° C. and a diffusion period of about 150 minutes. The $p^+$-type semiconductor regions $23_a$ may be $3\times10^{18}$ cm$^{-3}$ in surface impurity concentration and about three micrometers in diffusion depth.

Then the third mask 54, FIG. 7, is removed to expose the surface of the semiconductor substrate 41. Then, as shown in FIG. 7, the epitaxial layer 7 of n-type semiconductor is epitaxially grown in gaseous phase on the surface of the semiconductor substrate 41 or of the p-type semiconductor region 6 in which there have been formed the antimony-diffused regions $24_a$, $27_a$ and $10_a$ and phosphorus-diffused regions 51 and 52. The semiconductor substrate 41 is heated to a temperature of about 1180° C. during the growth of the n-type epitaxial layer 7 thereon, with the result that the antimony contained in the antimony-diffused regions $24_a$, $27_a$ and $10_a$, FIG. 7, the phosphorus contained in the phosphorus-diffused regions 51 and 52, and the boron contained in the $p^+$-type semiconductor region $23_a$ will disperse into the p-type semiconductor region 6 of the semiconductor substrate 41 and, at the same time, into the n-type epitaxial layer 7, resulting, as shown in both FIGS. 1 and 8, in the provision of the first embedded layer 8 constituted of the parts 24 and 25, the second embedded layer 9 constituted of the parts 27 and 28, the third embedded layer 10, and the $p^+$-type semiconductor regions $23_b$. The thicknesses $T_1$, $T_2$ and $T_3$ of the embedded layers 8, 9 and 10 are subject to change with the heat treatment for fabrication of the FETs 1 and 2 and transistor 3. For convenience of illustration and description, however, the embedded layers 8, 9 and 10 and their parts 24, 25, 27 and 28 are shown to be approximately the same in thickness in FIGS. 1, 8, 9 and 10.

Figure 8:
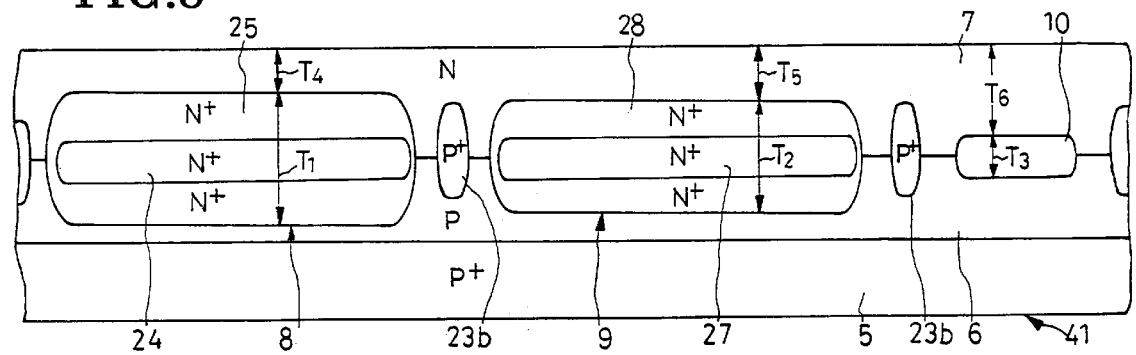
FIG. 8 is a section through the semiconductor substrate after the creation of an n-type epitaxial layer.

The first and third parts 24 and 27 shown in FIGS. 1 and 8 contain both antimony and phosphorus; the second and fourth parts 25 and 28 contain phosphorus; the third embedded layer 10 contains antimony; and the $p^+$-type semiconductor region $23_b$ contains boron. Since phosphorus is higher in diffusion rate than antimony as aforesaid, the phosphorus-diffused second and fourth parts 25 and 28 are created both above and below the first and third parts 24 and 27, respectively. The thicknesses $T_1$ and $T_2$ of the first and second embedded layers 8 and 9 are subject to change with the mean phosphorus concentration at the surface of the substrate 41. The first phosphorus-diffused region 51, FIG. 7, is higher in mean phosphorus concentration than the second phosphorus-diffused region 52. As a consequence, as the first and second embedded layers 8 and 9 are created by phosphorus diffusion due to heat treatment during the fabrication of the epitaxial layer 7 and during the subsequent production of the FETs 1 and 2 and transistor 3, the thickness $T_1$ of the first embedded layer 8 is to become greater than the thickness $T_2$ of the second embedded layer 9.

Being a phosphorus-free, antimony-diffused layer, the third embedded layer 10 has a thickness $T_3$ that is less than the thicknesses $T_1$ and $T_2$. The distance $T_4$ from the surface of the n-type epitaxial layer 7 to the first embedded layer 8 is less than the distance $T_5$ from the surface of the epitaxial layer 7 to the second embedded layer 9. The distance $T_6$ from the surface of the n-type epitaxial layer 7 to the third embedded layer 10 is greater than either of the distances $T_4$ and $T_5$.

The first embedded layer 8, constituted of the first and second parts 24 and 25, FIG. 8, provides a drain current path for the first FET 1, FIG. 1. The second embedded layer 9, likewise constituted of the third and fourth parts 27 and 28, provides a drain current path for the second FET 2.

The first and second phosphorus-diffused regions 51 and 52 are shown to be uneven in FIG. 7. However, thanks to phosphorus diffusion due to the epitaxial growth and subsequent heat treatment, there can be obtained the second and fourth parts 25 and 28 of approximately constant thickness as seen in FIGS. 8–10.

Figure 9:
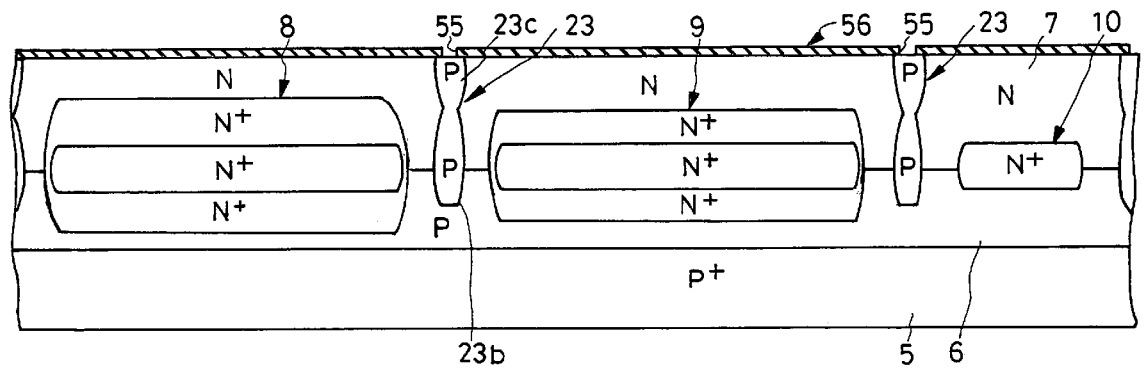
FIG. 9 is a section through the semiconductor substrate after the creation of a fourth mask and of a separation region.

Then, as shown in FIG. 9, there is formed on the surface of the n-type epitaxial layer 7 a fourth mask 56 in the form of silicon oxide film with a window or open pattern 55 for creation of the inter-element separation region 23 set forth with reference to FIG. 1. Boron, a p-type impurity, is subsequently introduced into the n-type epitaxial layer 7 through the mask window 55 thereby forming a p-type semiconductor region $23_c$ which constitutes the separation region 23 in combination with the underlying region $23_b$.

Figure 10:
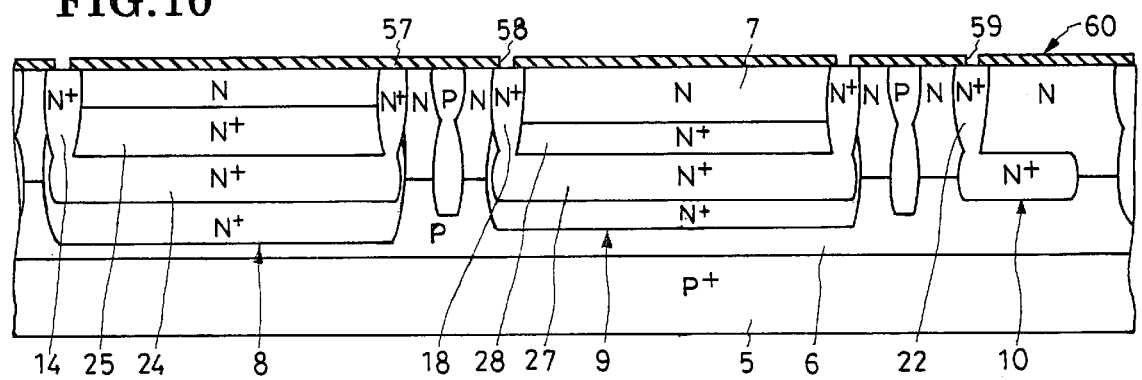
FIG. 10 is a section through the semiconductor substrate after the creation of a fifth mask and of a lead-out region.

Then, as shown in FIG. 10, there is formed on the surface of the n-type epitaxial layer 7 a fifth mask 60 having patterned windows 57, 58 and 59. Then, through these mask windows 57–59, an n-type impurity of phosphorus is selectively diffused in the n-type epitaxial layer 7 thereby concurrently creating the first and second drain lead-out regions 14 and 18 and the collector lead-out region 22. The drain lead-out regions 14 and 18 are of $n^+$-type semiconductor and are contiguous respectively to the first and third parts 24 and 27 of the first and second embedded layers 8 and 9 of the first and second FETs 1 and 2. The collector lead-out region 22 is of n-type semiconductor contiguous to the embedded layer 10 of the transistor 3.

Then, by the known diffusion method, there are simultaneously fabricated the p-type body regions 12 and 16 and n-type source regions 13 and 17 of the first and second FETs 1 and 2, FIG. 1, and the p-type base region 20 and n-type emitter region 21 of the transistor 3. The integrated semiconductor device of FIG. 1 is completed with the subsequent fabrication of the insulating film 30, drain electrodes 31 and 34, source electrodes 32 and 35, gate electrodes 33 and 36, collector electrode 37, emitter electrode 38, and base electrode 39.

In this mode of carrying out the invention, the body regions 12 and 16, which are p-type wells, of the FETs 1 and 2 and the base region 20 of the transistor 3 are all formed concurrently by boron diffusion using the same mask, and to the same depth from the surface of the n-type epitaxial layer 7. However, the first, second and third embedded layers 8, 9 and 10 are at the different distances $T_4$, $T_5$ and $T_6$ from the surface of the n-type epitaxial layer 7. As a result, the thickness of the first drain region 11 between the p-type body region 12 and first embedded layer 8 of the first FET 1 is less than the thickness of the second drain region 15 between the p-type body region 16 and second embedded layer 9 of the second FET 2 and than the thickness of the collector region 19 between the base region 20 and embedded layer 10 of the transistor 3.

The first embedded layer is higher in mean impurity concentration than the second embedded layer 9. Consequently, the drain current path of the first FET 1 when the same is conductive is less in electric resistance than that of the second FET 2. The first FET 1 is therefore less in power loss than the second FET 2. The drain region 15 of the second FET 2 is greater in thickness than the first drain region 11, and the second embedded layer 9 is less in mean impurity concentration than the first embedded layer 8, so that the drain-source voltage-withstanding capability of the second FET 2 is greater than that of the first FET 1. The collector region 19 of the bipolar transistor 3 has a greater thickness than do the drain regions 11 and 15 of the first and second FETs 1 and 2. The transistor 3 is therefore relatively high in base-collector and collector-emitter voltage-withstanding capability.

FIG. 10 shows the first and second drain lead-out regions 14 and 18 as being joined to the first an third embedded regions 24 and 27, and the collector lead-out region 22 to the third embedded layer 10. In the state of FIG. 10, however, the lead-out regions 14, 18 and 22 need not be sufficiently joined to the first and third parts 24 and 27 of the first and second embedded layers 8 and 9 and to the third embedded layer 10; instead, the sufficient connection of these regions may be accomplished by thermal diffusion during the fabrication of the p-type body regions 12 and 16, source regions 13 and 17, base region 20 and emitter region 21 shown in FIG. 1.

This mode of carrying out the invention gains the following advantages:

1. The first and second embedded layers 8 and 9 can be created by the same manufacturing process even though they differ in both thickness and mean impurity concentration. This is because the first and second embedded layers 8 and 9 can be made different in thickness and mean impurity concentration merely by use of a mask having different patterns for the phosphorus introduction windows 47 and 48 at the first and second preselected surface zones 49 and 50 for the first and second embedded layers 8 and 9. More specifically, the first preselected surface zone 49 is made higher in mean phosphorus concentration than the second preselected surface zone 50 by making the ratio $S_a/S_1$ of the total area $S_a$ of the first set of phosphorus introduction windows 47 to the area $S_1$ of the first preselected surface zone 49 higher than the ratio $S_b/S_2$ of the total area $S_b$ of the second set of phosphorus introduction windows 48 to the area $S_2$ of the second preselected surface zone 50. As a result, the first embedded layer 8 is made higher in thickness and mean impurity concentration than the second embedded layer 9. There can thus be concurrently and easily manufactured the first FET 1, which is less in drain-source resistance during conduction than the second FET 2, and the second FET 2 which is higher in drain-source voltage-withstanding capability than the first FET 1.

2. The first, second and third embedded layers 8, 9 and 10 of different thicknesses and different mean impurity concentrations can be created easily. The first and second embedded layers 8 and 9 of the first and second FETs 1 and 2 are formed by antimony and phosphorus, the latter being higher in diffusion rate than the former, whereas the third embedded layer 10 of the transistor 3 is formed by antimony. As a result, the first, second and third embedded layers 8, 9 and 10 of different thicknesses and different mean impurity concentrations are obtained by the same process of epitaxial growth and by the subsequent heat treatment. A decrease in the thickness of the third embedded layer 10 of the transistor 3 results in an increase in the thickness of the collector region 19 and hence in collector-base and collector-emitter voltage-withstanding capabilities.

3. The first and second embedded layers 8 and 9 are formed not solely by the phosphorus-introduced regions but by both antimony- and phosphorus-introduced regions. Consequently, the phosphorus concentration is held relatively low, and the phosphorus can be prevented from entering the epitaxial growth layer on the side of the bipolar transistor 3 during the progress of epitaxial growth. Should the first and second embedded layers 8 and 9 of the first and second FETs 1 and 2 be fabricated solely of phosphorus, and the embedded layer 10 of the transistor 3 solely of antimony, the first and second embedded layers 8 and 9 would be required to be higher in phosphorus concentration to an extent required by the absence of antimony. If the phosphorus-introduced regions of the semiconductor substrate 41 were made higher in impurity concentration in order to meet the above requirement, the phosphorus would evaporate during the process of epitaxial growth and find its way into the epitaxial growth layer for the transistor 3 thereby making it impossible to obtain the transistor 3 of desired characteristics. According to the present invention, however, the first and second embedded layers 8 and 9 are formed not only by phosphorus but also by antimony which is less in diffusion rate, and less easy to evaporate, than phosphorus, so that the phosphorus concentration need not be made so high as to deteriorate the performance of the transistor 3 by phosphorus evaporation.

4. The first and second embedded layers 8 and 9 are formed by both antimony and phosphorus, their thicknesses and impurity concentrations are easily adjustable, and so are the voltage-withstanding capabilities and resistance of the first and second FETs 1 and 2.

5. The first and second embedded layers 8 and 9 include the parts 24 and 27 containing antimony in high concentrations, any parasitic elements can be prevented from manifesting themselves between the p-type semiconductor region 6 and the first and second embedded layers 8 and 9.

Second Mode

The second preferred form of semiconductor device according to the invention will be described with reference to FIG. 11, in which parts having corresponding parts in the FIG. 1 device are indicated by the same reference characters as used to denote the corresponding parts in FIG. 1.

Figure 11:
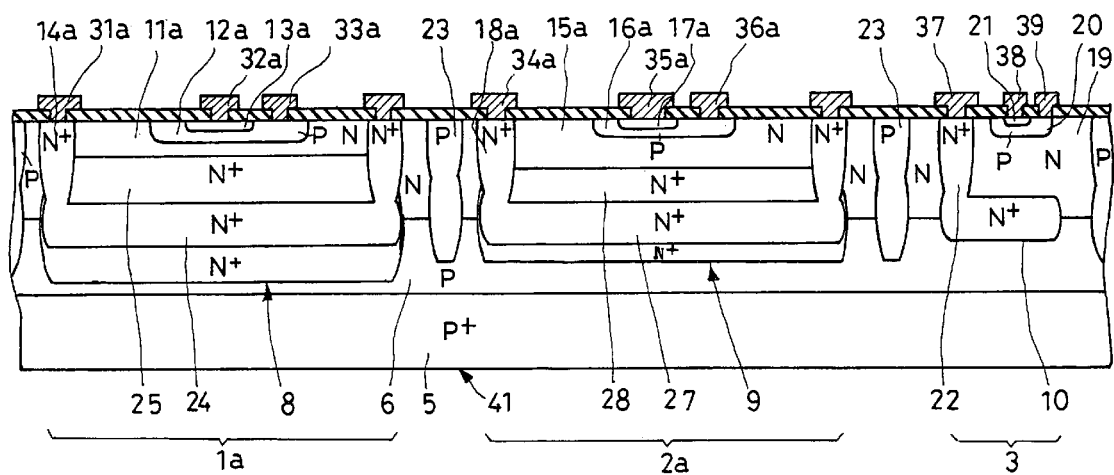
FIG. 11 is a section through another type of semiconductor device fabricated in a second preferred mode of carrying out the invention.

The semiconductor device of FIG. 11 is akin to the FIG. 1 device except that the former has first and second bipolar transistors $1_a$ and $2_a$ in substitution for the first and second FETs 1 and 2 of the latter. In other words, the FIG. 11 device has collector regions $11_a$ and $15_a$, base regions $12_a$ and $16_a$, emitter regions $13_a$ and $17_a$, collector lead-out regions $14_a$ and $18_a$, collector electrodes $31_a$ and $34_a$, emitter electrodes $32_a$ and $35_a$, and base electrodes $33_a$ and $36_a$ in places of the drain regions 11 and 15, body regions 12 and 16, source regions 13 and 17, drain lead-out regions 14 and 18, drain electrodes 31 and 24, source electrodes 32 and 35, and gate electrodes 3 and 36 of the FIG. 1 device. Both devices are alike in all the other details of construction.

The first, second and third embedded layers 8, 9 and 10 of FIG. 11 are formed by the same method as their FIG. 1 counterparts, so that this second mode gains the same advantages as does the first disclosed mode. The three bipolar transistors $1_a$, $2_a$ and 3 of different characteristics are easily fabricated.

Third Mode

Figure 6:
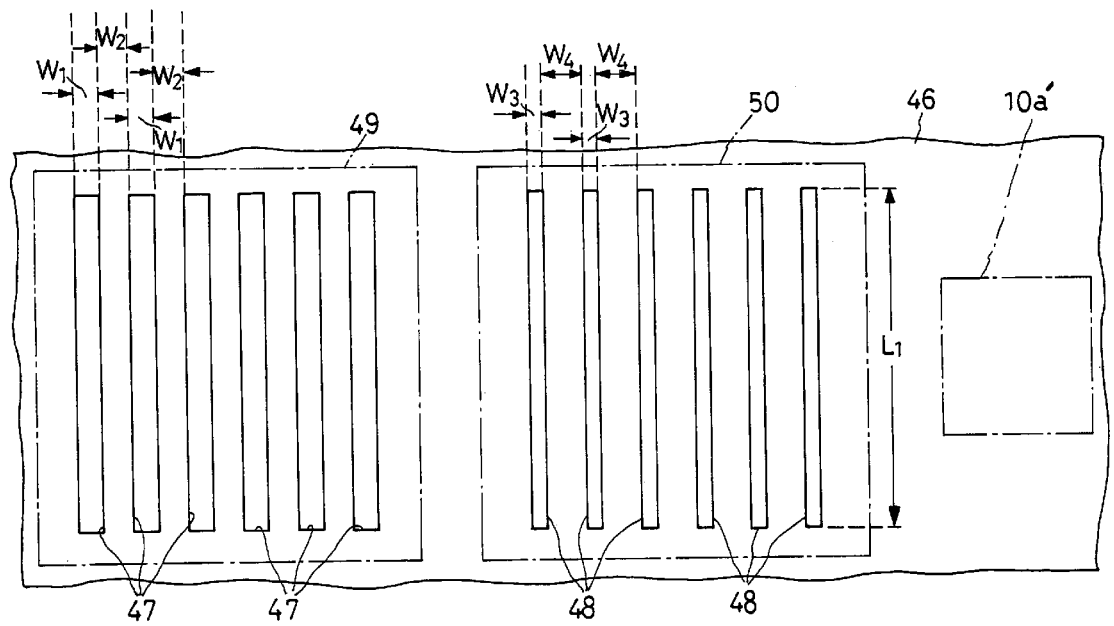
FIG. 6 is a plan view of the second mask of FIG. 5.
Figure 12:
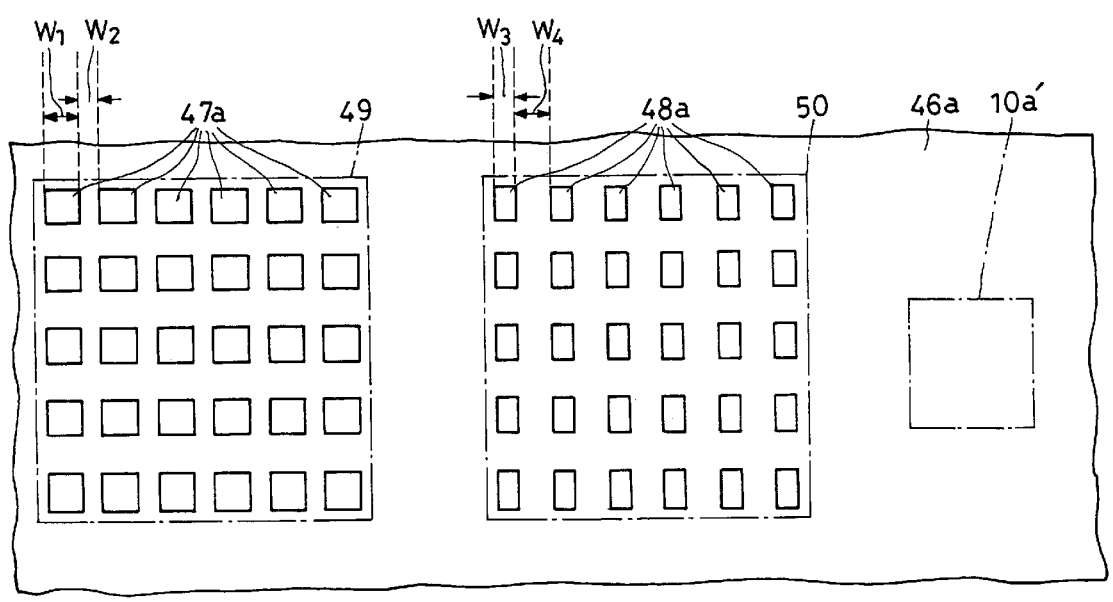
FIG. 12 is a plan view of a second mask for use in a third preferred mode of carrying out the invention.

FIG. 12 shows a modification $46_a$ of the second mask 46, FIG. 6. The modified second mask $46_a$ has a first and a second array of phosphorus introduction windows $47_a$ and $48_a$ which are each square in shape. The total area $S_a$ of the first set of windows $47_a$ is greater than the total area $S_b$ of the second set of windows $48_a$, so that different amounts of phosphorus can be introduced into the first and second preselected surface zones 49 and 50 through this modified mask $46_a$ as well. Thus the third mode gains the same advantageous effects as does the first.

Fourth Mode

Figure 13:
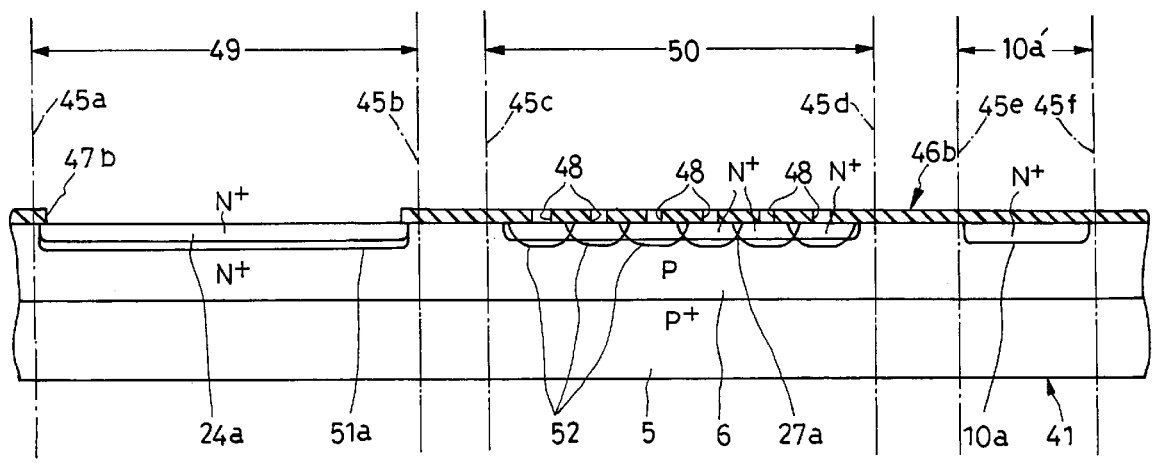
FIG. 13 is a plan view of a semiconductor substrate together with a second mask thereon for use in a fourth preferred mode of carrying out the invention.

FIG. 13 shows a modification $46_b$ of the second mask 46, FIGS. 5 and 6, and the semiconductor substrate 41 having first and second phosphorus-diffused regions $51_a$ and 52 formed by use of the modified second mask $46_b$. The modified second mask $46_b$ is similar in construction to its FIG. 5 counterpart 46 except that the former has a single modified window $47_b$ in place of the first phosphorus introduction windows 47 in the latter. The single modified window $47_b$ is slightly less in size than the first antimony introduction window $43_b$, FIG. 4. The single modified window $47_b$ has an area greater than the total area of the set of windows 48, so that the first and the second phosphorus-diffused regions $51_a$ and 52 formed by phosphorus introduction through these windows $47_b$ and 48 have the same relationship of relative impurity concentrations as do the phosphorus-diffused regions 51 and 52 of FIG. 5. Thus the fourth mode possesses the same advantages as does the first.

Fifth Mode

The fifth preferred form of semiconductor device and the method of its fabrication will be set forth with reference to FIGS. 14–17, in which parts having corresponding parts in FIGS. 1–10 are identified using like reference characters.

Figure 14:
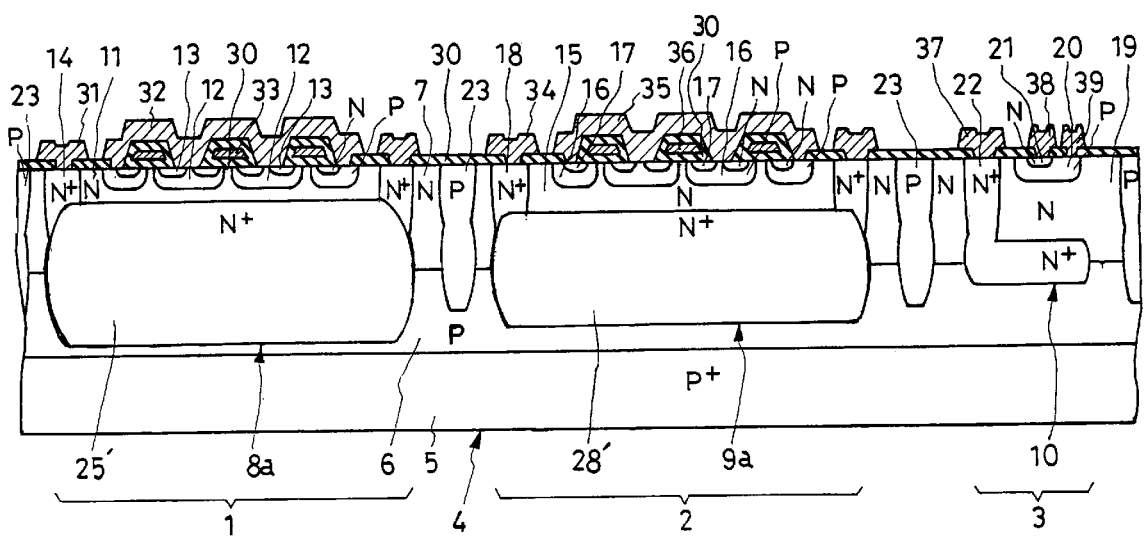
FIG. 14 is a section through still another type of semiconductor device to be fabricated in a fifth preferred mode of carrying out the invention.

As will be noted from FIG. 14, the fifth preferred form of semiconductor device is similar to the first preferred form of FIG. 1 except for the absence of the first and third parts 24 and 27 of the first and second embedded layers 8 and 9 containing both antimony and phosphorus. The first and second embedded layers $8_a$ an $9_a$ of FIG. 14 are therefore constituted solely of the first and second n$^+$-type semiconductor regions 25' and 28' which contains only phosphorus as an impurity like the second and fourth parts 25 and 28 of FIG. 1.

Figure 15:
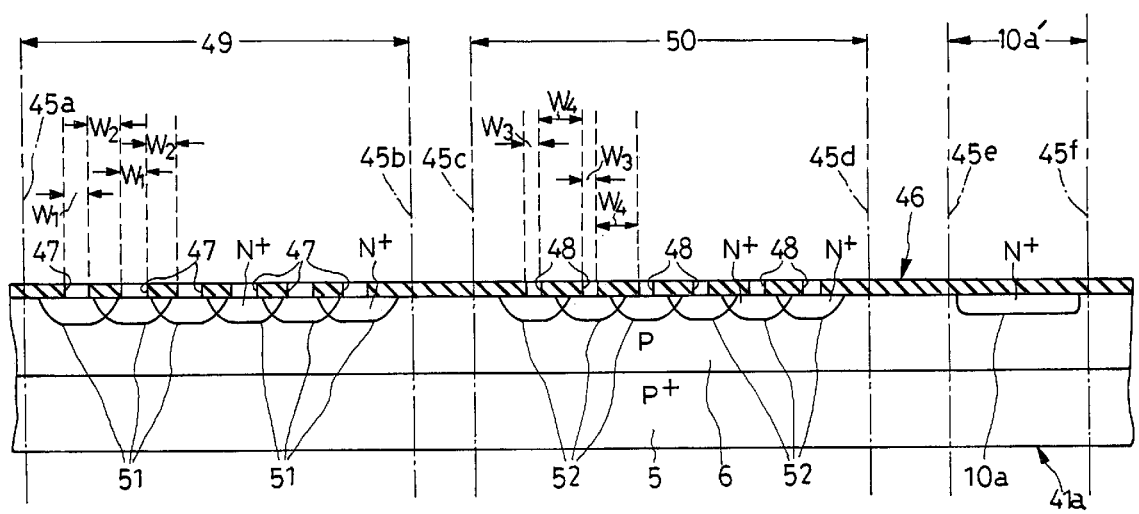
FIG. 15 is a section through the semiconductor substrate after the introduction of phosphorus through a mask in the course of the fabrication of the semiconductor device of FIG. 14.

The fabrication of the FIG. 14 semiconductor device starts with the preparation of a semiconductor substrate $41_a$ which, as shown in FIG. 15, has a p$^+$-type semiconductor region 5 and a p-type semiconductor region 6. This semiconductor substrate $41_a$ does not have the first and second antimony-diffused regions $24_a$ and $27_a$ shown in FIG. 4.

Then, as shown in FIG. 15, a mask 46 is formed on the surface of the p-type semiconductor region 6. This first mask 46 has the same open pattern as that of the second mask 46 seen n FIGS. 5 and 6. Thus the width $W_1$ of each of the first set of phosphorus introduction windows 47 is greater than the width $W_3$ of each of the second set of phosphorus introduction windows 48. Both first and second sets of phosphorus introduction windows 47 and 48 have the same length $L_1$. The ratio $S_a/S_1$ of the total area $S_a$ of the first set of six phosphorus introduction windows 47 to the surface area $S_1$ of the first preselected surface zone 49 is greater than the ratio $S_a/S_1$ of the total area $S_b$ of the second set of six phosphorus introduction windows 48 to the surface area $S_2$ of the second preselected surface zone 50.

Then, as set forth above with reference to FIG. 5, the n-type impurity of phosphorus is diffused in the p-type semiconductor region 6 through the first and second phosphorus introduction windows 47 and 48 of the first mask 46 thereby creating the first and second phosphorus-diffused regions 51 and 52. The concentration of the phosphorus is the highest at the surface of the p-type semiconductor region 6 and diminishes downwardly therefrom. The first preselected surface zone 49 is higher in the amount of phosphorus per unit area than the second preselected surface zone 50.

Figure 16:
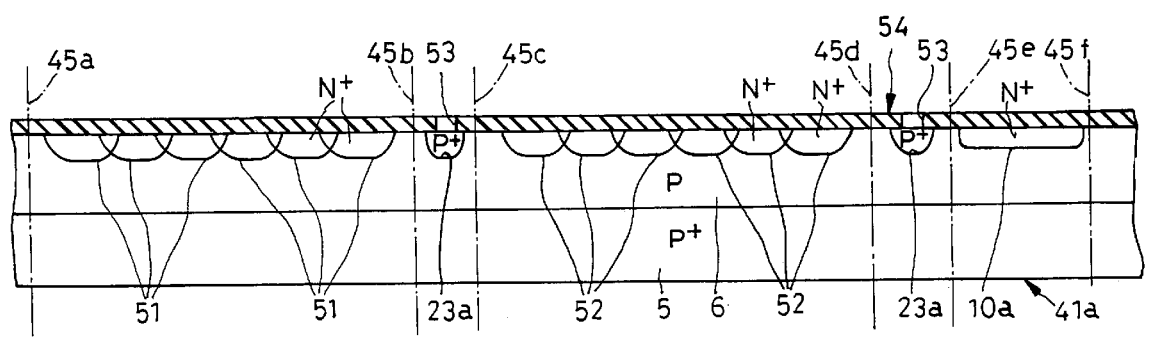
FIG. 16 is a section through the semiconductor substrate after the creation of a separation region.

Then, as shown in FIG. 16, a second mask 54 of silicon oxide film with an open pattern 53 is formed on the surface of the p-type semiconductor region 6, in which there have been formed the first and second phosphorus-diffused regions 51 and 52, or of the semiconductor substrate $41_a$. The second mask 54 of FIG. 16 is formed after removing the first mask 46 of FIG. 15. However, the removal of the first mask 46 is not an absolute requirement; instead, the second mask 54 may be overlaid on the first mask 46. The provision of the second mask 54 will be altogether unnecessary if the p$^+$-type semiconductor region $23_a$ or inter-element separation region 23 is formed by means other than masking. The second mask 54 of FIG. 16 has the same open pattern as does the third mask 54 of FIG. 7. The open pattern of the second mask 54 corresponds to the pattern of the separation region 23 of FIG. 14. Then the p$^+$-type semiconductor region $23_a$ is formed as in FIG. 7 by diffusing the p-type impurity of boron into the p-type semiconductor region 6 through the window 53 in the second mask 54.

Figure 17:
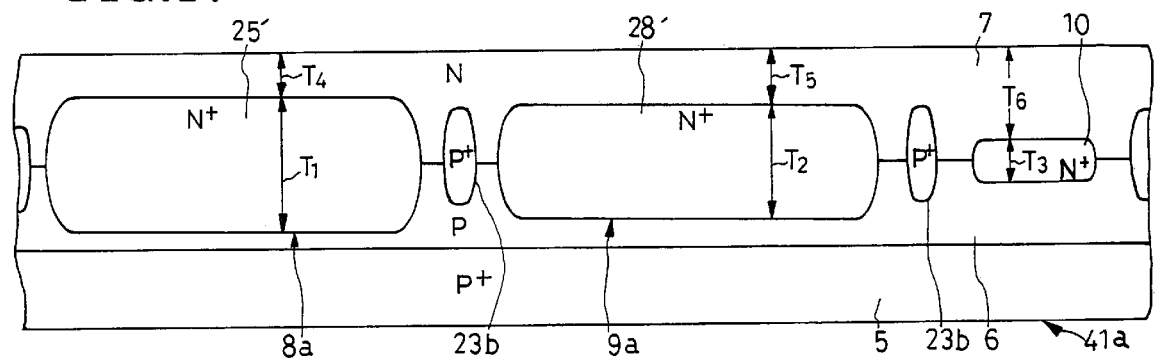
FIG. 17 is a section through the semiconductor substrate of FIG. 16 after the creation of an epitaxial layer.

Then, with the second mask 54, FIG. 16, removed to expose the surface of the semiconductor substrate $41_a$, the epitaxial layer 7 of an n-type semiconductor is grown as in FIG. 17 by gaseous phase epitaxy on the surface of the semiconductor substrate $41_a$ or that of the p-type semiconductor region 6 in which there have been formed the first and second antimony-diffused regions $10_a$ and phosphorus-diffused regions 51 and 52. The semiconductor substrate $41_a$ is heated to about 1180° C. in the course of the creation of the n-type epitaxial layer 7 by gaseous-phase epitaxy. Consequently, the antimony of the aintimony0diffused region $10_a$, FIG. 16, the phosphorus of the first and second phosphorus-diffused regions 51 and 52, and the boron of the p$^+$-type semiconductor region $23_a$ will diffuse into the p-type semiconductor region.

The first and second embedded layers $8_a$ and $9_a$ of FIG. 17 are constituted of the first and second phosphorus-diffused regions 25' and 28'.

The first phosphorus-diffused regions 51, FIG. 16, is higher in mean phosphorus concentration than the second phosphorus diffused region 52, so that the thickness $T_1$ of the first embedded layer $8_a$ is greater than the thickness $T_2$ of the second embedded layers $9_a$, the embedded layers $8_a$ and $9_a$ being created by phosphorus diffusion from the first and second phosphorus-diffused regions 51 and 52 during the heat treatments during the epitaxial growth and subsequent steps. The distance $T_4$ from the surface of the epitaxial layer 7 to the first embedded layer $8_a$ is less than the distance $T_5$ from the surface of the epitaxial layer 7 to the second embedded layer $9_a$. The first embedded layer $8_a$ is higher in mean impurity concentration than the second embedded layer $9_a$.

In the n-type semiconductor region 7 of FIG. 17 there are subsequently formed the inter-element separation region 23, drain lead-out regions 14 and 28, and collector lead-out region 22, by the same methods as set forth with reference to FIGS. 9 and 10. Thereafter the p-type body regions 12 and 16, n-type source regions 13 and 17, p-type base region 20, and n-type emitter region 21, all shown in FIG. 14, are formed by the same methods as in the first disclosed mode of carrying out the invention.

The fifth preferred form of semiconductor device shown in FIG. 14 is similar to that of FIG. 1 except for the absence of the embedded regions 24 and 27 containing both antimony and phosphorus. Thus the FIG. 14 device gains the same advantages as does the FIG. 1 device except for those accruing from antimony.

POSSIBLE MODIFICATIONS

The present invention is not to be limited by the foregoing modes of carrying out the invention but admits of a variety of modifications such as the following:

1. Additional semiconductor element such as a junction field-effect transistor or passive elements such as a resistor and capacitor may be formed in the epitaxial layer 7.

2. Although the first and second phosphorus introduction windows 47 and 48, or $47_a$ and $48_a$ are made different in area and equal in number in FIGS. 6 and 12, they could, instead, be made equal in area and different in number.

3. A field-effect transistor could be provided in place of the bipolar transistor 3.

4. The antimony-diffused regions $24_a$ and $27_a$ could be made so thick that the phosphorus-diffused regions 51 and 52, FIG. 5, had no parts underlying the antimony-diffused regions $24_a$ and $27_a$, or the second and fourth parts 25 and 27, FIG. 8, had no parts underlying the first and third parts 24 and 27.

5. Arsenic, rather than antimony, could be introduced into the first and third parts 24 and 27.

6. Either or both of the first embedded layer 8 or $8_a$ and second embedded layer 9 and $9_a$ could be formed down to the p$^+$-type semiconductor region 5.

7. The first and second FETs 1 and 2 and first and second bipolar transistors $1_a$ and $2_a$ could be replaced by other semiconductor elements such as insulated-gate bipolar transistors, thyristors, and diodes.

8. The first and second embedded layers 8 and 9 of the first and second bipolar transistors $1_a$ and $2_a$, FIG. 11, could be formed by semiconductor regions containing only phosphorus as in FIG. 14.

9. The first and second antimony-diffused regions $24_a$ and $27_a$, FIG. 13, are not absolute requirements.

What is claimed is:

1. A method of making a semiconductor device incorporating a plurality of semiconductor elements, which method is characterized by comprising the steps of:

(a) providing a semiconductor substrate (41) having formed therein a first semiconductor region (6) of a first conductivity type, said first semiconductor region having both a first preselected surface zone (49) for creation of a first embedded layer (8) for a first semiconductor element (1 or $1_a$) and a second preselected surface zone (50) for creation of a second embedded layer (9) for a second semiconductor element (2 or $2_a$);

(b) overlaying said semiconductor substrate with a first mask (44) for selectively introducing into said semiconductor substrate a first impurity substance of a second conductivity type which is opposite to said first conductivity type, said first mask having formed therein a first window ($43_a$) for exposing said first pre-selected surface zone and a second window ($43_b$) for exposing said second preselected surface zone;

(c) concurrently creating a second and a third semiconductor region ($24_a$ and $27_a$) by introducing said first impurity substance into said first semiconductor region (6) through said first and said second window in said first mask;

(d) overlaying said semiconductor substrate with a second mask (46 or $46_a$) for selectively introducing into said semiconductor substrate a second impurity substance which has said second conductivity type and which is higher in diffusion coefficient than said first impurity substance, said second mask having formed therein both a first set of windows (47 or $47_a$) for exposing parts of said second semiconductor region ($24_a$) and a second set of windows (48 or $48_a$) for exposing parts of said third semiconductor region ($27_a$), said first and said second set of windows in said mask being such that the ratio ($S_a/S_1$) of the total area ($S_a$) of said first set of windows to the area ($S_1$) of said first preselected surface zone of said semiconductor substrate is greater than the ratio ($S_b/S_2$) of the total area ($S_b$) of said second set of windows to the area ($S_2$) of said second preselected surface zone of said semiconductor substrate;

(e) creating a fourth semiconductor region (51 or $51_a$) and a fifth semiconductor region (52) as parts of said first embedded layer (8 or $8_a$) and said second embedded layer (9 or $9_a$) by introducing said second impurity substance into said semiconductor substrate (41) through said first set of windows (47 or $47_a$) and said second set of windows (48 or $48_a$) in said second mask; and (f) causing an epitaxial layer (7) of said second conductivity type, which is less in impurity concentration than said second and said third and said fourth and said fifth semiconductor region, to grow on the surface of said semiconductor substrate (41), thereby providing, due to thermal diffusion of said first and said second impurity substance, said first embedded layer (8 or $8_a$) and said second embedded layer (9 or $9_a$), said first embedded layer being constituted of a first part (24) which contains both said first and said second impurity substance and of a second part (25) which contains said second impurity substance, said second embedded layer being constituted of a third part (27) which contains both said first and said second impurity substance and of a fourth part (28) which contains said second impurity substance, said second embedded layer being less in thickness than said first embedded layer.

2. A method of making a semiconductor device as claimed in claim 1, characterized by further comprising the steps of:

(a) concurrently creating a first and a second body region (12 and 16) for a first and a second insulated-gate field-effect transistor as said first and said second semiconductor element by selectively diffusing an impurity substance of said first conductivity type in said epitaxial layer (7); and (b) concurrently creating a first and a second source region (13 and 17) by selectively diffusing an impurity substance of said second conductivity type in said first and said second body region (12 and 16).

3. A method of making a semiconductor device as claimed in claim 1, characterized by further comprising the steps of:

(a) concurrently creating a first and a second base region (12$_a$ and 16$_a$) for a first and a second bipolar transistor (1$_a$ and 2$_a$) as said first and said second semiconductor element by selectively diffusing an impurity substance of said first conductivity type in said epitaxial layer (7); and (b) concurrently creating a first and a second emitter region (13$_a$ and 17$_a$) by selectively diffusing an impurity substance of said first conductivity type in said first and said second base region (12$_a$ and 16$_a$) for said first and said second transistor (1$_a$ and 2$_a$).

4. A method of making a semiconductor device as claimed in claim 1, characterized in that said first impurity substance is antimony, and that said second impurity substance is phosphorus.

5. A method of making a semiconductor device as claimed in claim 1, characterized in that each of said first and said second set of windows in said second mask are in the form of a juxtaposition of elongate windows (47 and 48).

6. A method of making a semiconductor device as claimed in claim 1, characterized in that each of said first and said second set of windows in said second mask are in the form of an array of windows (47$_a$ and 48$_a$).

7. A method of making a semiconductor device incorporating a plurality of semiconductor elements, which method is characterized by comprising the steps of:

(a) providing a semiconductor substrate (41) having formed therein a first semiconductor region (6) of a first conductivity type, said first semiconductor region having all three of a first preselected surface zone (49) for creation of a first embedded layer (8) for a first semiconductor element (1 or 1$_a$), a second preselected surface zone (50) for creation of a second embedded layer (9) for a second semiconductor element (2 or 2$_a$), and a third preselected surface zone (10$_a$') for creation of a third embedded layer (10) for a third semiconductor element (3);

(b) overlaying said semiconductor substrate with a first mask (44) for selectively introducing into said semiconductor substrate a first impurity substance of a second conductivity type which is opposite to said first conductivity type, said first mask having formed therein a first window (43$_a$) for exposing said first preselected surface zone, a second window (43$_b$) for exposing said second preselected surface zone, and a third window (43$_c$) for exposing said third preselected surface zone;

(c) concurrently creating a second and a third and a fourth semiconductor region (24$_a$, 27$_a$ and 10$_a$) by introducing said first impurity substance into said first semiconductor region through said first and said second and said third window in said first mask;

(d) overlaying said semiconductor substrate with a second mask (46, 46$_a$ or 46$_b$) for selectively introducing into said semiconductor substrate a second impurity substance which has said second conductivity type and which is higher in diffusion coefficient than said first impurity substance, said second mask having formed therein both a first set of windows (47 or 47$_a$) for exposing parts of said second semiconductor region (24$_a$) and a second set of windows (48 or 48$_a$) for exposing parts of said third semiconductor region (27$_a$), said first and said second set of windows in said mask being such that the ratio ($S_a/S_1$) of the total area ($S_a$) of said first set of windows to the area ($S_1$) of said first preselected surface zone of said semiconductor substrate is greater than the ratio ($S_b/S_2$) of the total area ($S_b$) of said second set of windows to the area ($S_2$) of said second preselected surface zone of said semiconductor substrate;

(e) creating a fifth semiconductor region (51) and a sixth semiconductor region (52) as parts of said first embedded layer (8) and said second embedded layer (9) by introducing said second impurity substance into said semiconductor substrate impurity substance into said semiconductor substrate (41) through said first set of windows (47 or 47$_a$) and said second set of windows (48 or 48$_a$) in said second mask; and (f) causing an epitaxial layer (7) of said second conductivity type, which is less in impurity concentration than said second and said third and said fourth and said fifth and said sixth semiconductor region, to grow on the surface of said semiconductor substrate (41), thereby providing, due to thermal diffusion of said first and said second impurity substance, said first embedded layer (8) and said second embedded layer (9) and said third embedded layer (10), said first embedded layer being constituted of a first part (24) which contains both said first and said second impurity substance and of a second part (25) which contains said second impurity substance, said second embedded layer being constituted of a third part (27) which contains both said first and said second impurity substance and of a fourth part (28) which contains said second impurity substance, said second embedded layer being less in thickness than said first embedded layer, said third embedded layer being constituted of a region containing said first impurity substance.

* * * * *